(12) United States Patent
Kozodoy et al.

(10) Patent No.: US 10,304,983 B2
(45) Date of Patent: May 28, 2019

(54) SUNLIGHT COLLECTION SYSTEM WITH LIGHTGUIDE HAVING SOLID AND FLUID COMPONENTS

(71) Applicant: Glint Photonics, Inc., Burlingame, CA (US)

(72) Inventors: Peter Kozodoy, Palo Alto, CA (US); Christopher Gladden, San Mateo, CA (US); Michael Pavilonis, San Francisco, CA (US); Christopher Rhodes, Oakland, CA (US)

(73) Assignee: Glint Photonics, Inc., Burlingame, CA (US)

( * ) Notice: Subject to any disclaimer, the term of this patent is extended or adjusted under 35 U.S.C. 154(b) by 297 days.

(21) Appl. No.: 15/333,970

(22) Filed: Oct. 25, 2016

(65) Prior Publication Data
US 2017/0115473 A1    Apr. 27, 2017

Related U.S. Application Data

(60) Provisional application No. 62/246,622, filed on Oct. 27, 2015.

(51) Int. Cl.
*H01L 31/054* (2014.01)
*F21S 11/00* (2006.01)
(Continued)

(52) U.S. Cl.
CPC ........ *H01L 31/0547* (2014.12); *F21S 11/002* (2013.01); *F24S 23/00* (2018.05);
(Continued)

(58) Field of Classification Search
None
See application file for complete search history.

(56) References Cited

U.S. PATENT DOCUMENTS 9,274,266 B2    3/2016  Ford et al.
2011/0226332 A1    9/2011  Ford et al.
(Continued)

FOREIGN PATENT DOCUMENTS

WO    2010007568 A1    1/2010

OTHER PUBLICATIONS

PCT/US2016/058950 EPO as ISA, "International Search Report and Written Opinion", 13 pages.
(Continued)

*Primary Examiner* — Michael Stahl
(74) *Attorney, Agent, or Firm* — Patent Law Group LLP; Brian D. Ogonowsky (57) ABSTRACT

The system captures and concentrates sunlight for transmission to interior spaces or to a PV system. A solar collector uses arrayed refractive lenses and opposing concave focusing mirrors and a movable coupling sheet forming part of a lightguide. The transparent sheet contains small angled mirrors, where each angled mirror corresponds to a particular set of the lenses/focusing mirrors and is in the focal plane. The lightguide also includes a fluid surrounding the transparent sheet, and lower index cladding layers sandwich the fluid. The sheet is translated within the fluid by an actuator to position the angled mirrors at the focal points of the sunlight for maximum deflection of the sunlight to an edge of the lightguide for extraction to a light transmission system or to a PV system. A position sensor on the sheet provides feedback regarding the position of the angled mirrors relative to the focal points.

24 Claims, 8 Drawing Sheets

(51) Int. Cl.
  *F24S 23/00* (2018.01)
  *F24S 23/70* (2018.01)
  *F24S 23/30* (2018.01)
  *F21V 8/00* (2006.01)
  *G02B 6/35* (2006.01)

(52) U.S. Cl.
  CPC .............. *F24S 23/12* (2018.05); *F24S 23/30* (2018.05); *F24S 23/70* (2018.05); *H01L 31/0543* (2014.12); *G02B 6/003* (2013.01); *G02B 6/0018* (2013.01); *G02B 6/3538* (2013.01); *Y02B 10/20* (2013.01); *Y02E 10/44* (2013.01); *Y02E 10/52* (2013.01)

(56) References Cited

U.S. PATENT DOCUMENTS

| | | |
|---|---|---|
| 2012/0056081 A1 | 3/2012 | Kozodoy |
| 2013/0160820 A1* | 6/2013 | Lin ................. H01L 31/0525 136/246 |
| 2014/0261621 A1* | 9/2014 | Gruhlke ............. H01L 31/0547 136/246 |

OTHER PUBLICATIONS

Mellette et al., "Planar waveguide LED illuminator with controlled directionality and divergence", Optics Express, Apr. 1, 2014, pp. A742-A758, vol. 22, No. S3.

Price et al., "Wide-angle planar microtracking for quasi-static microcell concentrating photovoltaics", Nature Communications, Feb. 5, 2015, pp. 1-8, Macmillan Publishers Limited.

EPO as ISA for PCT/US2018/016271, "International Search Report and Written Opinion", dated Apr. 20, 2018, 15 pages.

\* cited by examiner

SUNLIGHT COLLECTION SYSTEM WITH LIGHTGUIDE HAVING SOLID AND FLUID COMPONENTS

CROSS-REFERENCE TO RELATED APPLICATIONS

This application claims priority to U.S. provisional application Ser. No. 62/246,622, filed Oct. 27, 2015, by Peter Kozodoy et al., incorporated herein by reference.

GOVERNMENT LICENSE RIGHTS

This invention was made with Government support under contract DE-AR0000332 awarded by the Advanced Research Projects Agency-Energy (ARPA-E), a division of the Department of Energy. The Government has certain rights in the invention.

FIELD OF THE INVENTION

The present invention relates to optical systems for capturing and concentrating sunlight so that it may be used for interior illumination or for directing light into a photovoltaic system.

BACKGROUND

U.S. Pat. No. 9,274,266 describes a solar concentrator that contains an array of focusing lenses and a corresponding array of convex focusing mirrors. The combination of refractive lenses and reflectors is known as catadioptric pairs. Between the lenses and mirrors at the focal plane is a movable transparent lightguide having an array of angled reflector elements, where there is one angled reflective element per pair of lenses and focusing mirrors. When the focal spots of the lenses/mirrors fall upon the reflector elements, the light is optimally deflected into the lightguide and is trapped by total internal reflection (TIR) until the light exits an edge of the light guide. Photovoltaic (PV) cells are attached along the edge of the lightguide. The lightguide is translated laterally so that the reflector elements remain aligned with the focal spots as the angle of incident sunlight changes over time so there is a maximum of light that is emitted by the edge of the lightguide.

A related prior art solar concentrator (described in Nature Communications, DOI:10.1038/ncomms7223, Entitled Wide-Angle Planar Microtracking for Quasi-Static Microcell Concentrating Photovoltaics, 2015, by Price et al.) contains an array of top focusing lenses and bottom focusing mirrors, forming catadioptric pairs. The array of catadioptric pairs provides an array of focal spots, and the catadioptric pairs are optimized so that the focal spots remain substantially in a single plane as the angle of incident sunlight varies over a wide range. A corresponding array of photovoltaic cells on a moveable sheet translates at the focal plane of the catadioptric pairs by microtracking so that the focal spots of the catadioptric pairs remain aligned with the photovoltaic cells as the angle of incident sunlight changes over time.

A drawback of the two systems described above is that they require movement of the entire lightguide (including the PV cells at the lightguide output) or PV sheet relative to the catadioptric pairs. This requires external moving parts, subject to degradation in the environment. A further limitation of both prior art systems is that the designs are solely intended for electricity generation and do not contemplate the harvest of concentrated light for interior illumination.

What is needed is a sunlight collection and concentration system that is highly robust, requires minimal control systems, is very flexible in its implementation, and provides high-quality sunlight for interior illumination.

SUMMARY

In one embodiment, the system captures and concentrates sunlight for transmission to interior spaces as an illumination source. A solar collector using arrayed catadioptric focusing optics and a movable coupling sheet within a lightguide is combined with an edge-mounted fiber optic bundle, or other optical transmitter, to deliver sunlight into interior spaces.

The lightguide includes a transparent solid sheet containing small angled mirrors, where each mirror corresponds to a particular pair of a refractive focusing lens and a focusing mirror, in a catadioptric array. The lightguide also includes a fluid, such as a transparent oil, surrounding the transparent sheet. The fluid is substantially stationary and is contained in a sealed transparent cavity. The refractive index of the fluid may match that of the sheet, and low index transparent cladding layers sandwich the fluid, so that light is internally reflected within both the fluid and the sheet. Therefore, light exits through a wall of the stationary transparent cavity containing the fluid and the sheet. The cladding layers may be robust and form the upper and lower walls of the cavity, or the cladding layers may be a thin outer or inner layer on robust cavity walls. The transparent cavity may be surrounded by a layer of air to create an additional TIR layer. In all cases, the overall lightguide (including the movable sheet and fluid) may be kept stationary and consistently guide light to the stationary exit wall, despite internal motions of the movable sheet which cause the position of the angled mirrors within the lightguide to be varied. The sheet is suspended in the fluid and is easily translated by a magnetic system, a piezo electric system, or other suitable system. In one embodiment, a mechanical actuator is not needed, and the sheet is translated by a heat-related system that positions the sheet to its optimal position based on fluid dynamics.

If the fluid has the same index as the sheet and guides light, the light exits through the entire area of the cavity wall abutting the fluid. The light exit window of the cavity may be formed of a high index material.

Alternatively, the fluid may have a refractive index lower than that of the movable sheet, so that when light enters the transparent sheet, it is internally reflected in the sheet due to the index mismatch between the sheet and the fluid, and the light eventually exits through an edge of the lightguide. The low index cladding layers may additionally reflect back any light that enters the fluid. The cladding layers (or the cavity) may be surrounded by a layer of air to create an additional TIR layer.

If the top surface of the refractive lens array is not normal with respect to the sun's rays, the focusing point will not be directly below the center of the lenses. A photosensor system connected to the sheet senses the position of the sheet relative to the optimal position and provides feedback to an actuator for positioning the sheet so that the sunlight is focused on the angled mirrors within the sheet and reflected toward a light exit edge of the lightguide.

The concentrated light impinging on the edge of the lightguide is extracted and applied to a flexible hollow light tube, fiber optic bundle, or other type of transmission optics for supplying light to the interior of a building. The transmission optics does not move with the sheet since the transmission optics is optically connected to the transparent cavity containing the sheet and the fluid. Since the sunlight is concentrated, it can be conveyed through a small penetration in the building exterior and routed as desired within the building.

The sheet can be programmed by the user to be positioned to not output the maximum amount of light so dimming is possible.

The sunlight collector can be mounted in a low-profile stationary configuration, obviating the need for tracking systems that tilt the system toward the sun.

In another embodiment, PV cells are optically coupled to the edge of the lightguide (i.e., to the stationary exit surface of the transparent cavity) for generating power. In one embodiment, the deflection optics in the lightguide split the light so that the light extracted at one edge illuminates the interior of a building and the light extracted at another edge is directed to the PV cells. Since the PV cells can be stationary and external to the cavity, there is no requirement for wires to enter the cavity, greatly simplifying the design.

Compared to prior-art non-concentrating daylighting systems, such as windows and skylights, the system provides the benefits of reduced building penetration area and improved ability to route sunlight as desired within the building. Compared to conventional concentrating daylighting systems, it provides the benefit of stationary mounting, a flat form factor, and low system mass.

A further understanding of the nature and advantages of the present invention may be realized by reference to the remaining portions of the specification and the drawings.

BRIEF DESCRIPTION OF THE DRAWINGS

Elements that are the same or equivalent in the various figures are labeled with the same numeral.

DETAILED DESCRIPTION

Figure 1:
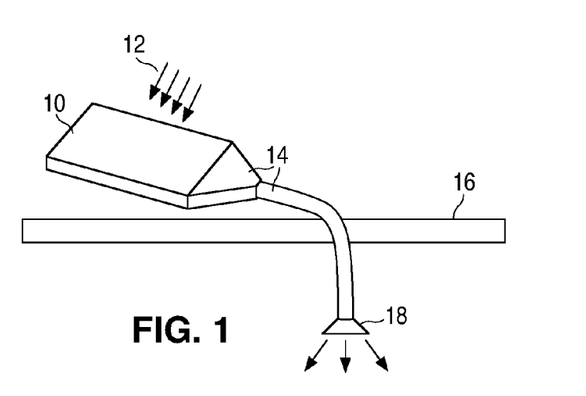
FIG. 1 is schematic of a daylighting system in accordance with one embodiment of the invention.

FIG. 1 illustrates a solar concentrator panel 10 receiving direct sunlight 12 and directing the impinging sunlight to an extraction edge of the panel 10, where the concentrated light is then directed by transmission optics 14 to illuminate the inside of a building 16. A luminaire 18 may be used to create a desired light emission profile inside the building.

Figure 2:
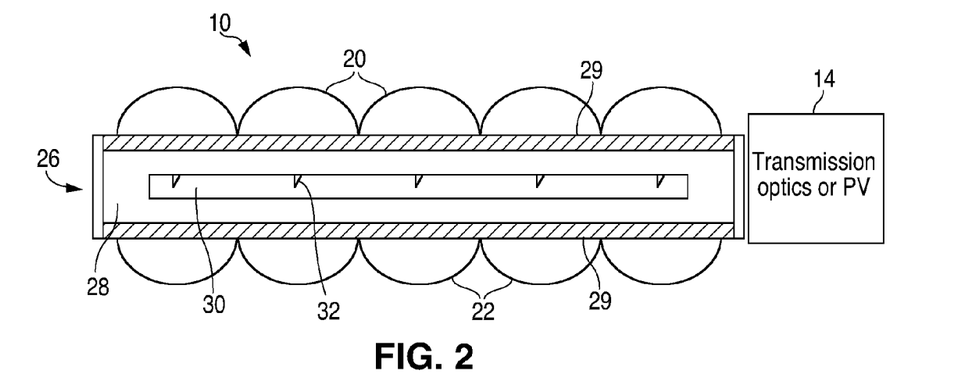
FIG. 2 is a cross-sectional view of focusing optics and a lightguide, where the lightguide comprises a solid transparent movable sheet and a transparent fluid surrounding the sheet, where the fluid and sheet are contained in a transparent sealed cavity.

FIG. 2 shows a cross-section of one embodiment of the collection optics.

The collection optics comprises an array of catadioptric focusing elements (catadioptric pairs), each catadioptric focusing element comprising a front refractive focusing lens 20 and a back reflecting, concave focusing mirror 22. The shape of these two optical elements in the catadioptric pair is optimized so that collimated incident light produces a well-focused spot on a single focal plane over a wide range of incident angles, for example within a cone of half-angle measuring 40° or more, and most preferably at least 60°, from the normal to the lens surface. The top lens array may be molded plastic. The reflective focusing mirror array may be a molded plastic sheet with a thin reflective film or a stamped reflective metal sheet.

A single panel 10 may be on the order of 3 square feet. Each lens 20 and mirror 22 may have a diameter of about 2 cm, and the thickness of the panel 10 may be about 1-3 cm.

Between the refractive lenses and the reflective focusing mirrors is a lightguide 26 that comprises a transparent fluid 28 contained between two or more transparent cladding layers 29, forming the upper and lower walls of a sealed cavity. The top and bottom cladding layers 29 adjacent the fluid 28 have a low index of refraction so there is total internal reflection (TIR) within the lightguide 26. The cladding layers 29 may be a transparent solid such as a fluorinated polymer, or may instead be a low index non-solid gel or gas abutting a surface of the sealed transparent cavity. The lightguide 26 also comprises a movable solid transparent sheet 30 that is suspended within the fluid 28 at the focal plane of the catadioptric focusing elements. The fluid 28 layer may be very thin. The sheet 30 thickness may be less than 0.5 cm.

Figure 3:
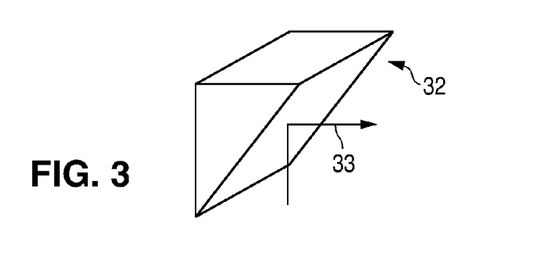
FIG. 3 is a perspective view one of the angled mirrors in the movable sheet that are optimally positioned at the focal points of the sunlight so the maximum amount of sunlight is directed to an edge of the lightguide and out of the sealed cavity.

The movable sheet 30 contains an array of small tilted mirrors 32 matching the periodicity of the lens/mirror arrays. FIG. 3 is a perspective view of one of the mirrors 32 and a light ray 33 being reflected off the tilted face. Prisms may be used instead of mirrors, where the prisms reflect by TIR. When the sheet 30 is moved within the xy plane so that the tilted mirrors 32 are at the focal spots, the light at the focal spots is deflected sideways (to the right) by the mirrors 32 so that all or most of it is captured in guided modes of the lightguide 26 by TIR. The right edge of the lightguide 26, which may be the external face of the sealed cavity, is a light extraction surface and may include light extraction features, such as a roughened surface to reduce TIR off the edge. The stationary extraction surface is optically coupled to light transmission optics 14 or a PV system.

The movable sheet 30 is translated within the fluid 28 so that the mirrors 32 follow the locations of the focal spots as the angle of incident sun light varies over time. Each mirror surface has an area about 0.5% that of its associated refractive lens 20. The movable sheet 30 may be caused to move within the fluid 28 to track the sun by any of a variety of mechanisms, described later.

The tilted mirrors 32 in the sheet 30 may have a single tilted side (which may be at 45°) so that all light is directed to one extraction edge of the rectangular lightguide 26, or the mirrors may have two or more tilted sides that divide the impinging light and direct the light to two or more edges of the lightguide 26. The mirrors 32 may be formed by molding the transparent sheet 30 to have the indented wedges of FIG. 3, then a reflective material, such as silver, is deposited in the indented wedges, such as using screen printing or deposition using a mask, to form a reflective film. In another embodiment, the tilted surface of the mirrors 32 is not flat but may be curved.

All layers are chosen to have a high transmission of visible wavelength light. The cladding layers 29 have a refractive index that is lower than the refractive index of the lightguide layers so that light is captured within the lightguide 26 (the fluid 28 and the sheet 30) by TIR. Separate cladding layers 29 may not be needed if the lens 20 and mirror 22 layers have a sufficiently low refractive index. The transparent cavity may be substantially surrounded by an air gap to provide an additional TIR interface in the event light enters the cladding layers 29.

The lenses 20 and movable sheet 30 may be made of glass or a transparent polymer such as PMMA or polycarbonate or other transparent polymers. The cladding layers 29 may be made of a fluoropolymer, an aerogel, a gas such as air, or any other low-refractive-index material.

In one embodiment, the lens array 40 has an index of 1.5, and the cladding layers 29 have a lower index of 1.3. The fluid 28 and sheet 30 may have the same index as the sheet 30, or have an index higher than that of the sheet 30 (which would still be higher than the index of the cladding layers 29), or the fluid 28 may have a lower index than the sheet 30 so the light is confined to the sheet 30 by TIR. The cladding layers 29 preferably have a refractive index between 1 and 1.35, and the lightguide 26 materials preferably have a refractive index between 1.45 and 1.6.

The fluid 28 within the lightguide 26, in one embodiment, has a refractive index close to or equal that of the solid sheet 30. It may be composed of an oil, such as hydrocarbon or silicone oil or a mixture thereof. It may contain oils that are modified by the addition of phenyl groups or halogens to increase refractive index. It may also be composed of a polar fluid such as an aqueous solution, or a glycol or glycerin containing fluid or a mixture thereof. Thiodiglycol is an example polar fluid of high refractive index that may be used in the lightguide 26. The fluid 28 may have a density substantially equal to that of the solid sheet 30, so the sheet 30 is essentially suspended in the fluid 28. Alternatively, the sheet 30 is suspended in the fluid 28 by magnetic coupling. Although the fluid 28 may have some slight coloration, it is still considered transparent for purposes of this disclosure, since the coloration does not substantially reduce the amount of light passing through the thin layer of fluid 28.

In another embodiment, the fluid 28 has an index lower than that of the sheet 30, so that light is guided only within the sheet 30 by TIR. In such a case, the fluid 28 acts as cladding layers for the sheet 30. The lightguide 26 will then only be the movable sheet 30. The light exiting the edge of the sheet 30 then passes through the fluid 28 and through a transparent wall of the sealed cavity. Separate cladding layers 29 are not needed in this case. The transparent cavity may be substantially surrounded by an air gap to provide an additional TIR interface to reflect back any light entering the fluid 28.

Although non-gas fluids are preferred for the fluid 28 for ease of use, the fluid 28 may be a gas, such as air, and the sheet 30 may be suspended in the gas by a suitable low-friction support structure or a magnetic support.

The guided light impinges on the light exit window of the lightguide 26 (the right edge shown in FIG. 2) at an angle close to normal so light is extracted from the guide efficiently. Other edges of the lightguide 26 may have a reflective layer to prevent light escaping through other than the intended light extraction edge.

The concentrator panel 10 may be mounted on a moving structure that follows the sun in order to maximize sunlight collection. Alternatively, the panel 10 may be mounted in a fixed stationary configuration. It is a special characteristic of this invention that it allows high-efficiency sunlight collection and concentration over a wide range of incident angles, permitting use in a stationary configuration.

Figure 4:
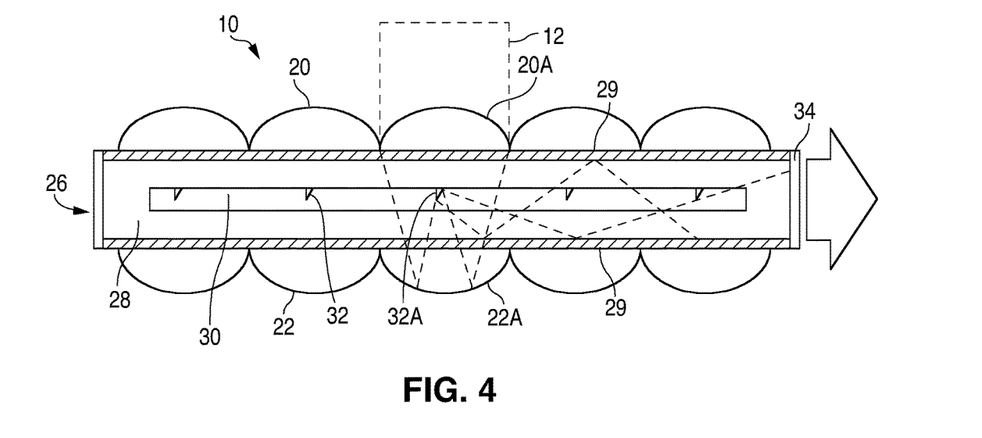
FIG. 4 illustrates sunlight rays impinging on the input lenses at a normal angle, where the transparent sheet is positioned so that the angled mirrors are centered with respect to the focusing lenses and concave focusing mirrors for optimal light output. In the example, the angled mirrors have two tilted surfaces for deflecting the light toward two edges of the lightguide.

FIG. 4 illustrates sunlight 12 at a normal angle relative to the panel 10. The sunlight entering the lens 20A is refracted to the middle of the focusing mirror 22A, which then focuses all the light to the tilted mirror 32A, which is centered with respect to the lens 20A and mirror 22A. The light is highly concentrated, since the entire area of sunlight entering the lens 20A is focused on a mirror surface that may have an area that is 0.5% that of the lens 20A. This light is directed at a 90° angle to the stationary light extraction edge 34, where it is optically coupled to the transmission optics 14 of FIG. 1 or coupled to PV cells along the edge. It is assumed that the fluid 28 has the same refractive index as the sheet 30 so guides the light along with the sheet 30. A cladding layer 29, forming at least part of the upper and lower walls of the cavity, has a lower index so there is TIR at the cladding layer 29 interface. The light extraction edge 34 of the transparent cavity may be formed of a relatively high index material to minimize TIR.

Figure 5:
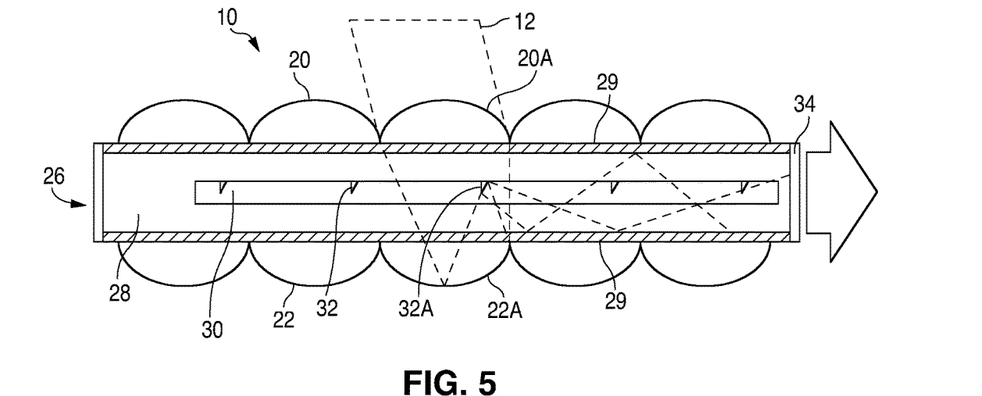
FIG. 5 illustrates sunlight rays impinging on the input lenses at a non-normal angle, where the transparent sheet is shifted so that the angled mirrors receive focused light from the concave focusing mirrors for optimal light output.

FIG. 5 illustrates sunlight 12 at a non-normal angle relative to the panel 10. The sunlight entering the lens 20A is refracted to the right side of the focusing mirror 22A, which then focuses all the light to the right of the center of the lens/mirror pair. A photosensor (described later) on the sheet 30 provides a feedback signal that identifies an optimal xy position of the sheet 30, and an actuator (described later) shifts the sheet 30 so that the maximum amount of light is reflected off the tilted mirror 32A. In the example, the sheet 30 is shifted to the right.

The refractive lens array may be formed with a plano front surface facing the sun instead of a convex front surface. This provides a system with a flat front surface which can provide reduced fouling and easier system cleaning.

A number of mechanisms may be used to move the sheet 30 over the course of the day so that the tilted mirrors 32, or other reflective features, are always located at the focal point of the sunlight. If an active control system is used, two components are required: a sensing mechanism that determines how the sheet 30 must be moved in order to bring the reflective features to the focal points, and an actuation mechanism that produces the desired movement of the sheet 30. An active control system also permits intentional misalignment of the system if less-than-perfect tracking is desired, for example, to dim or shutter the daylight provided by the system.

Figure 6A:
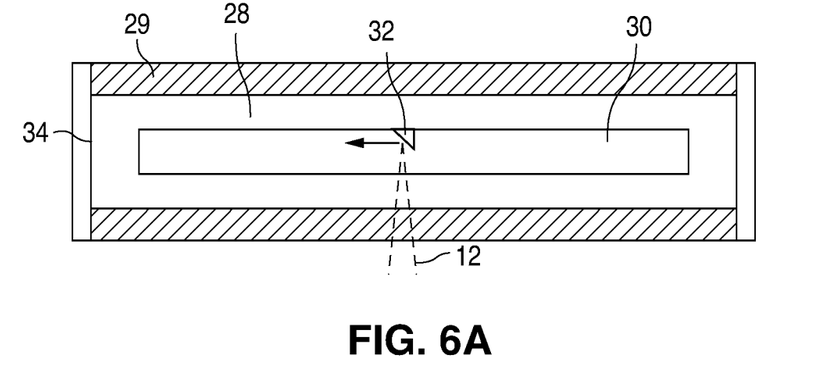
FIGS. 6A, 6B, and 6C are cross-sectional views of various embodiments of the lightguide portion of FIG. 2.
Figure 6B:
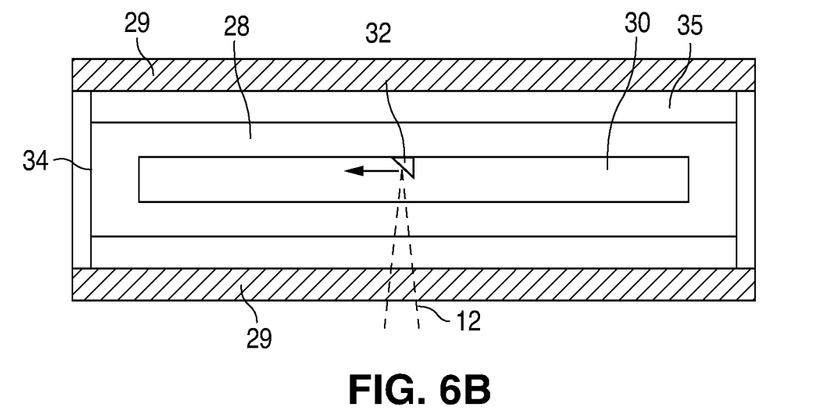
Figure 6C:
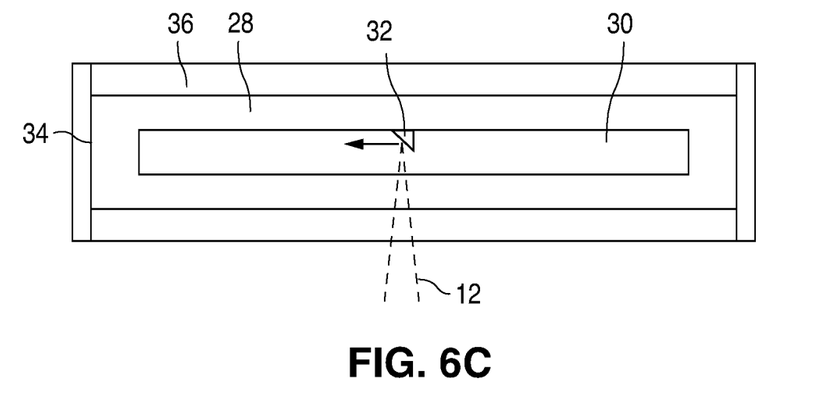

FIGS. 6A-6C illustrate various embodiments of the lightguide and transparent cavity without the lenses and mirrors.

In FIG. 6A, the sunlight 12 ray from the concave focusing mirror is focused on the tilted mirror 32 in the movable sheet 30. The light ray is then deflected to the light extraction edge 34 of the lightguide. The fluid 28 has a refractive index matching that of the sheet, and the cladding layers 29 have a lower index so there is TIR at the interface, and light is contained within the fluid 28 and sheet 30. The sandwiching cladding layers 29 form part of the transparent walls providing fluid containment. The cladding layers 29 can be a thin fluoropolymer film applied to solid sheets of acrylic for mechanic support.

FIG. 6B is similar to FIG. 6A but the transparent fluid cavity is formed of a high index solid material 35. Low index cladding layers 29 on the outside of the material 25 cause there to be TIR at the interface. The cladding layers 29 can be a thin film that does not provide significant mechanical support, and can even be a gas layer.

In FIG. 6C, the fluid 28 has a low refractive index (lower than that of the sheet 30) so there is TIR at the interface, and light is contained only within the sheet 30. Hence, the fluid 28 provides the optical cladding. The cavity walls 36 may be a high index material providing fluid containment. Air may surround the cavity walls 36 to provide a TIR interface in the event light enters the cavity walls 36. One drawback of this technique is that the low index fluid 28 is between the extraction edge of the sheet 30 and the light exit edge 34 of the lightguide, so there may be some spreading of the light between the sheet 30 edge and the light exit edge 34 of the lightguide.

Figure 7:
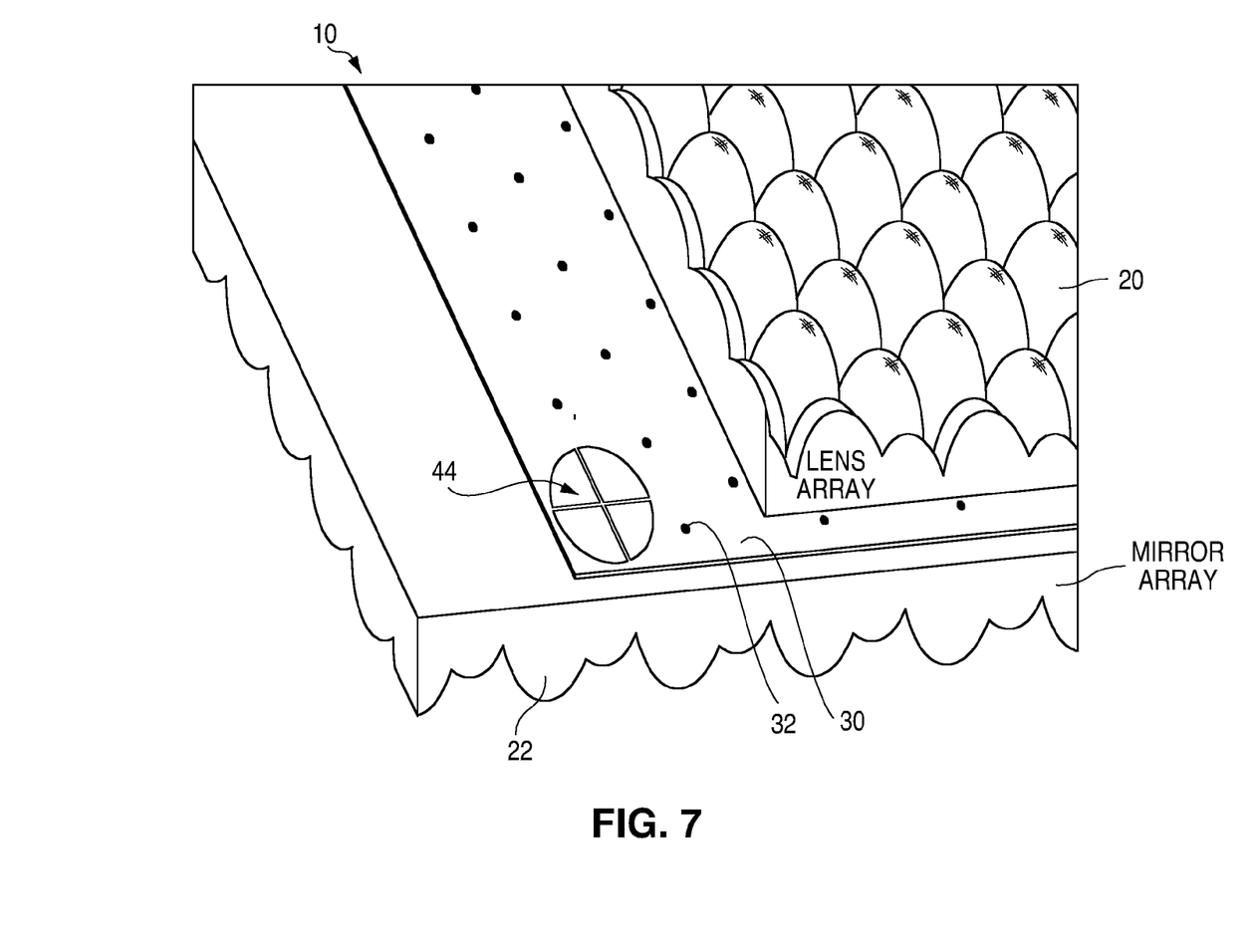
FIG. 7 is a cut-away perspective view of the focusing lens array, the floating transparent sheet (part of the lightguide), and the mirror array. A photosensor (active or passive) is shown in the sheet for providing feedback to optimally position the sheet.

FIG. 7 is a simplified cut-away view of the panel 10 showing the lens array (containing lenses 20), the mirror array (containing focusing mirrors 22), and the movable sheet 30 (containing mirrors 32). The fluid and cladding layers are not shown. At one or more locations substituting for a tilted mirror 32 is a photosensor 44. Many different designs of the photosensor 44 are possible, where the photosensor 44 generally provides a light signal or an electrical signal related to the optimal position of the sheet 30.

For example, if the photo sensor 44 is an active electrical component, such as a photo-transistor, photo-resistor, or photo-diode, there may be four photosensors arranged in quadrants. An actuator shifts the sheet 30 small increments. When the levels of the electrical signals from all four quadrants are the same, the center of the photosensor is centered with the focal point of the sunlight, and the actuator stops shifting the sheet 30. An algorithm may be used, in combination with the feedback signals, that predicts the movement of the sun's rays so that the light is substantially always focused on the tilted mirrors 32. The feedback signals may be converted to a light signal that is detected by another photo sensor external to the lightguide. Any needed electrical power within the cavity may be generated by PV cells on the sheet 30, so the cavity can be sealed.

Many variations on this photosensor design are possible. In one embodiment, the different photosensing segments are placed in different locations on the movable sheet 30 so that they receive light from different catadioptric pairs, instead of all receiving light from a single catadioptric pair.

Furthermore, redundant segmented sensing elements may be placed at various locations across the sheet 30 to provide accurate tracking in case one of the sensors is blocked (for example by partial shading of the panel). Multiple sensing elements also permits separate measurement of the misalignment of the movable sheet 30 due to translational error and rotational error.

It is desirable that the photosensing elements be semi-transparent so that they do not block all incident light as it transits from the refractive lens 20 to the focusing mirror 22. Semi-transparent photosensing elements may be achieved by using semi-transparent photosensitive materials or by patterning opaque photosensitive materials so that they provide partial light transmission, for example by perforating the photosensitive material.

Figure 8:
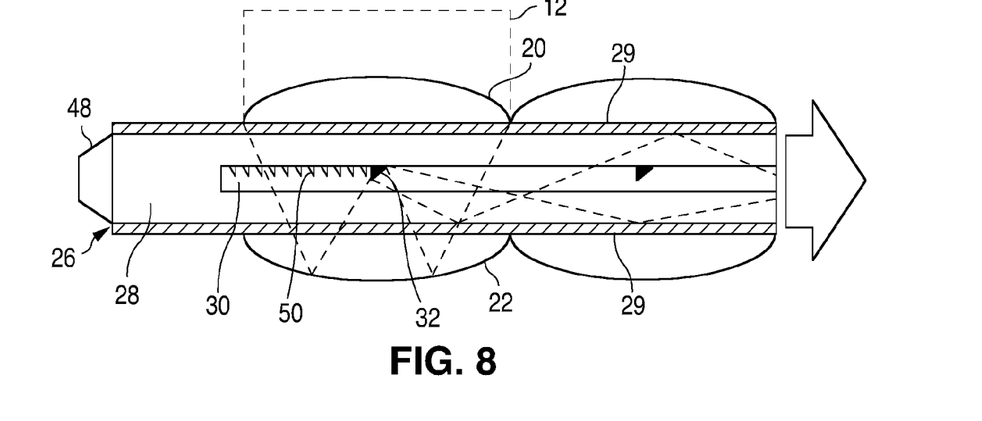
FIGS. 8, 9, and 10 illustrate the use of a 4-segment photosensor system, which comprises electronic sensors and angled mirrors, where the detected reflections from a variety of different mirrors on the sheet identify specific displacement errors relative to an optimal position of the sheet.
Figure 9:
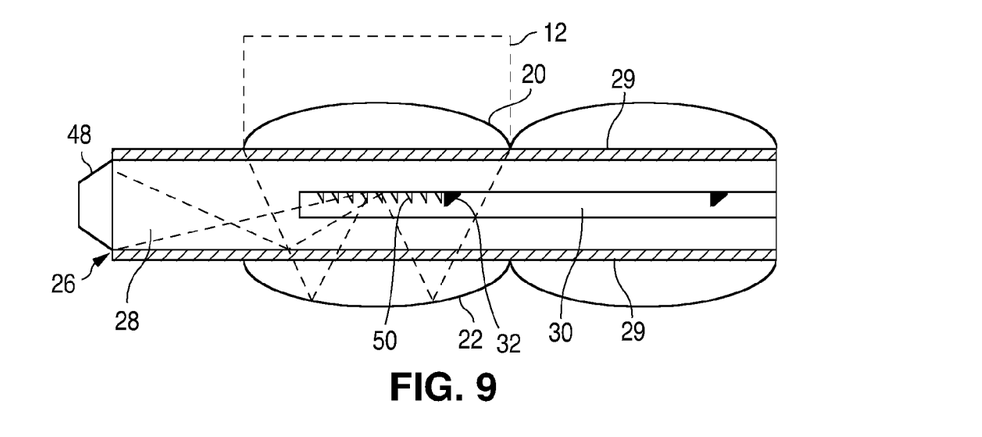
Figure 10:
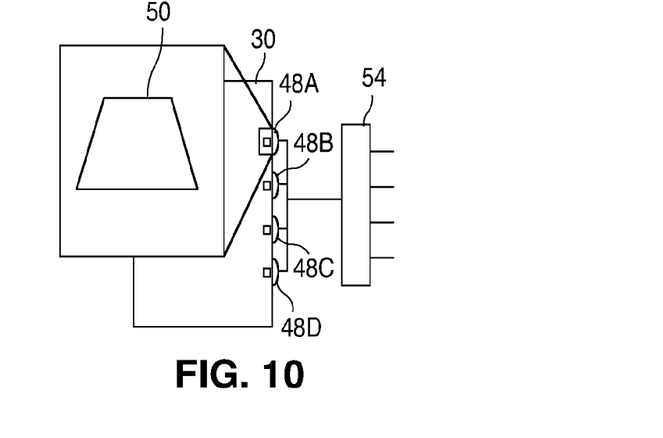

Another possible position-sensing mechanism is shown in FIGS. 8-10. This design uses an area of different types of reflectors (reflector segments 50) on the sheet 30 that occupy a segment of the focal plane for a catadioptric pair and, when illuminated by focused light, deflect that light toward the back facet of the lightguide where photosensors 48 (or 48A-48D in FIG. 10) are positioned. The relative output signal levels of the photosensors 48A-48D can therefore be used to determine if the sheet 30 is at an optimal position. Since there are no electrical components on the sheet 30, the fabrication of the device may be greatly simplified.

In one example, the reflector segments 50 on the sheet 30 are tilted mirrors, each with a different rotational angle so that light from the focusing mirrors 22 reflects off the faces of the different reflector segments 50, and the reflected light is directed towards associated external photosensors 48A-48D. By sensing the relative amounts of light reflected by each reflector segment 50, a microcontroller 54 (FIG. 10) can determine which xy direction to shift the sheet 30. When the light reflected by each reflector segment 50 meets a certain criteria, the sheet 30 is optimally positioned. Many configurations may be employed using this general concept of sensor mirrors on the sheet 30.

Each reflector segment 50 may be positioned in the focal plane of a different catadioptric pair, as shown in FIG. 10, and/or by grouping a number of reflector segments 50 in the focal plane of a single catadioptric pair, with the reflector segments 50 angled so that each segment 50 produces a spatially-distinct light output. In either case, measurement and control circuitry measures the photoresponse of each of the photosensors to determine the location of the focal spots and to actuate the appropriate movement of the movable sheet 30 to bring it into proper alignment with the focal spots formed by the catadioptric pairs. It is desirable that the reflector segments be semi-transparent so they preferably provide reflection only over a portion of the area. This is preferably achieved by forming the reflector segments 50 as a sparse array of tilted reflectors.

In FIG. 8, the sheet 30 is optimally aligned with the sunlight 12, so a maximum level of light is reflected by the tilted mirrors 32 toward the right edge extraction surface for illuminating a room. The reflector segments 50 for the photosensor may be positioned so that, at the optimal sheet 30 position, no light is reflected by the reflector segments 50.

For example, the reflector segments 50 may surround a tilted mirror 32. The tilted mirrors 32 may be much larger than the reflector segments since illumination light is wasted when reflected by the reflector segments.

In FIG. 9, the sheet 30 is misaligned so there is little light that is reflected off the tilted mirror 32, but the light is focused on some of the reflector segments 50 and directed toward photosensors 48 along the opposite edge of the lightguide 26 for controlling the actuator to shift the sheet 30.

FIG. 10 is a simplified top down view of the sheet 30 with four different types of reflector segments 50 distributed between selected catadioptric pairs. Each different reflector segment 50 type directs light towards an associated photosensor 48A-48D. A microprocessor 54 detects the relative levels of the reflected light to detect which direction to move the sheet 30 and when the position is optimal.

The actuation mechanism for the sheet 30 may include one or more motors to provide sheet 30 translation. These motors may be placed within the fluid cavity to act directly on the sheet 30, or preferably placed outside of the fluid cavity and coupled with a motion transmission mechanism to move the movable sheet 30 via magnetic coupling or other non-contact system.

Figure 11:
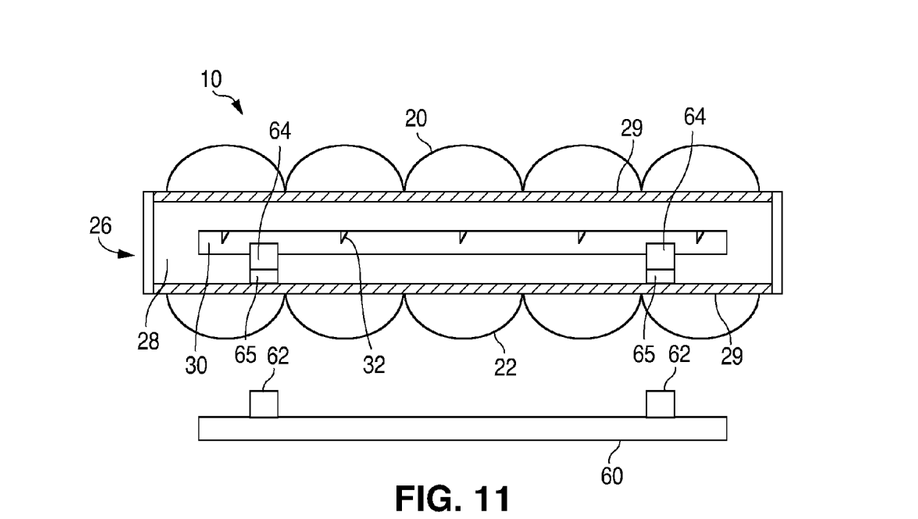
FIG. 11 illustrates the use of a non-contact actuator for translating the sheet using magnets.

FIG. 11 illustrates an xy motorized stage 60 driven by stepper motors, servos or gear motors, etc. that is located external to the panel lightguide 26. Magnets 62 on the motorized stage 60 magnetically couple to magnets 64 or ferrous elements on the sheet 30 causing the sheet 30 to move with motions that correspond exactly to those of the motor-driven magnets 62. A spacer/lubrication layer 65 spaces the sheet 30 from the inner wall of the cavity (which in the example is the cladding layer 29) and provides low friction. Very little force is needed to move the sheet 30 since it is substantially floating in the fluid 28.

Figures 12, 13:
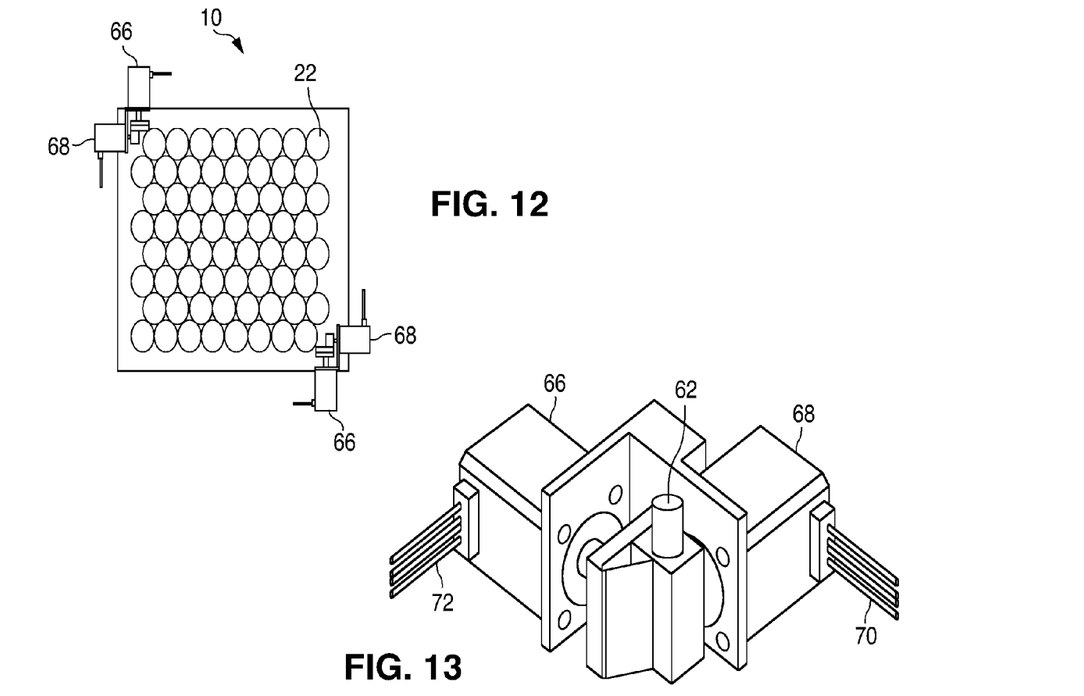
FIG. 12 illustrates the bottom of the solar concentrator panel and non-contact actuators that translate the sheet using magnets.
FIG. 13 illustrates further detail of the actuator magnetically coupled to one corner of the sheet.

FIG. 12 illustrates the bottom of the panel 10, where x and y actuators 66 and 68, respectively, are at opposite corners. FIG. 13 illustrates details of the actuators 66 and 68 and the magnet 62 moved by the actuators 66 and 68. The actuators 66 and 68 have small motors and gears that engage screws 70 and 72 to precisely shift the magnet 62 in the desired xy directions. Magnet coupling is preferred to direct coupling since the lightguide 26 cavity may be sealed.

Optionally, smooth motion of the movable sheet 30 can be achieved in this configuration by applying ferrofluid as a lubricating layer that is bound to the magnet attached to the movable sheet 30 and by optimizing the surface across which the magnet on the movable sheet 30 slides, for example, by using a fluoropolymer surface. The ferrofluid is preferably chosen to be immiscible with the liquid contained within the lightguide 26. The surface over which the magnet on the movable sheet 30 slides may optionally be chosen to be a porous solid with a network of pores that are preferentially wet either by the ferrofluid or by the surrounding ambient fluid.

In another embodiment, the transmission mechanism is a string or wire that connects the motor to the movable sheet 30, penetrating the lightguide 26 cavity. Turning the motor winds the string around a spindle, advancing the moving sheet 30 in the direction of the wire. Reversing the motor moves the sheet in the opposite direction. However, a fluid-tight seal is needed for the wires. Alternatively, the heavier lens/mirror arrays can be shifted relative to a stationary lightguide 26.

An additional motor-wire system may also compensate for incidental rotational of the movable sheet 30.

In another embodiment, linear actuators penetrate the lightguide 26 cavity and push directly on the movable sheet 30 to effect its motion. Such actuators may optionally be placed instead within the fluid cavity. Alternatively, actuators may contact the movable sheet 30 using only leadscrews or push rods. In this case, the body of the actuator resides outside of the fluid cavity, and the leadscrew or push rod enters the fluid cavity by way of a straight or threaded hole in the cavity sidewall. This hole is sized and shaped as a sliding seal, such that liquid does not leave the fluid cavity.

Piezoelectric actuators may also be used to provide actuation of the movable sheet 30. Because they can be small, these actuators are well-suited for placement within the fluid cavity of the lightguide 26. Many types of piezoelectric actuators may be used, including stacked piezo actuators, "squiggle" rotating actuators, "inchworm" actuator sets, and "stick/slip" actuators.

In another embodiment, a mechanical actuator is not needed, and the sheet 30 is translated by a heat-related system that positions the sheet 30 to its optimal position based on fluid dynamics.

If mounted in a stationary configuration, the collecting panel 10 is preferably located in order to receive the maximum amount of direct sunlight. In general, this is accomplished by placing the panel 10 so that it faces toward the equator and is tilted away from horizontal at an angle equal to the latitude of the location. However, other mounting positions may be used for a variety of reasons, including to adjust for the presence of trees, buildings, or other shadowing objects; to shift the seasonal or daily output profile of the system as desired; and to integrate within building architecture as desired. The panels 10 may be placed on the roof of a building, on a facade, as a portion of an awning, or in other locations or configurations as desired.

As described above, when the solar concentrator panel 10 is used for illuminating a room, transmission optics can be connected to the panel edge in order to route the high-flux light indoors as desired. Various types of transmission optics are possible.

Figure 14:
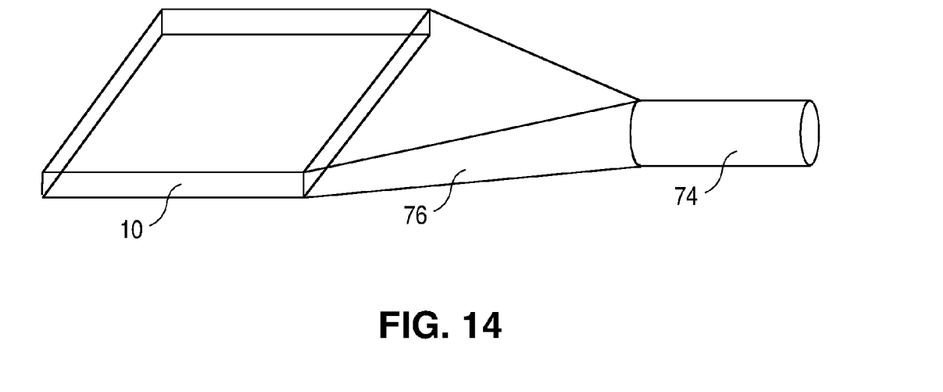
FIG. 14 illustrates the use of the solar concentrator to couple sunlight into a light tube, fiber optics, or other light conduit for supplying light inside a building.

FIG. 14 shows an example of an array of flexible fiber optics 74 optically coupled to the edge of the panel 10 via a tapered section 76 of the fiber optics to accept the concentrated sunlight. These fiber optics 74 may be formed of glass or polymer and of varying diameter as desired. They may be arranged to form a dense array at the emitting face of the concentrator panel 10 and then gathered into a bundle for efficient routing within the building structure. The fiber ends may be embedded in a potting material such as epoxy to form the array. Alternatively, the fiber ends may be fused together to form the array. The fibers may be circular in cross-section or have another cross-sectional geometry such as square, rectangular, or hexagonal in order to provide high packing density in an array.

Alternatively, a hollow light guide may be optically coupled to the edge of the panel 10. The hollow transmission lightguide is lined with reflective material to confine and guide light. The reflective material on the interior may provide specular or scattering reflection of the light or a combination of the two. The reflective lining may be made using a metal film, a multilayer dielectric that provides broadband reflection from interference effects, a prismatic reflector that utilizes TIR, or other techniques. The hollow transmission light guide may be tapered to match the dimensions of the panel lightguide where they meet, or may be connected to the panel lightguide by other optical elements that efficiently convey light from the panel output to the hollow transmission light-guide.

Figure 15:
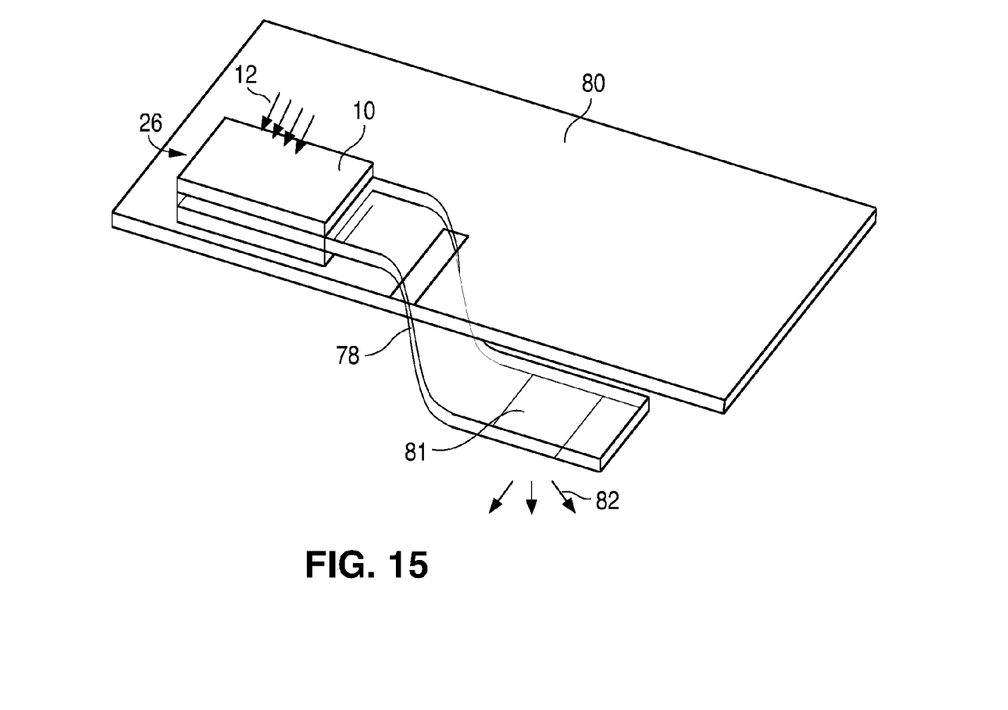
FIG. 15 illustrates the use of a relatively broad light transmission guide providing a wide overhead lighting surface in a building.

FIG. 15 shows the use of a solid slab ribbon lightguide 78 for light transmission within a building 80. The ribbon lightguide 78 is surrounded by low-index cladding material. The ribbon lightguide 78 may be matched to the edge of the concentrator panel lightguide 26, or a number of ribbon lightguides may be attached to the panel lightguide 26 in an array. The ribbon lightguide 78 may be made flexible or rigid, as desired. A portion 81 of the ribbon lightguide 78 may be modified to form an embedded luminaire by texturing the ribbon or producing other optical modifications that cause guided light 82 to locally exit the lightguide 78.

The transmission optics may also be a non-flexible solid lightguide structure that mates onto the edge of the concentrator panel 10 and can be designed to convey the concentrated light as desired. It may be made of a high refractive-index solid with low-index cladding to confine light by TIR. It may also have areas that are coated with reflecting materials to control the flow of light. The solid structure can also be shaped to provide a desired light-emission pattern from the output end so that it provides some of the functions of a luminaire. The solid lightguide transmission structure may be used with a facade-mounted concentrator panel. The solid lightguide transmission structure transmits the concentrated sunlight a short distance, emitting it through a small window in the building exterior wall into a desired range of output angles and bouncing some of the light off the ceiling so that it penetrates deeply into the building interior.

The panel 10 may also direct concentrated sunlight to PV cells or a PV panel to generate power.

Figure 16:
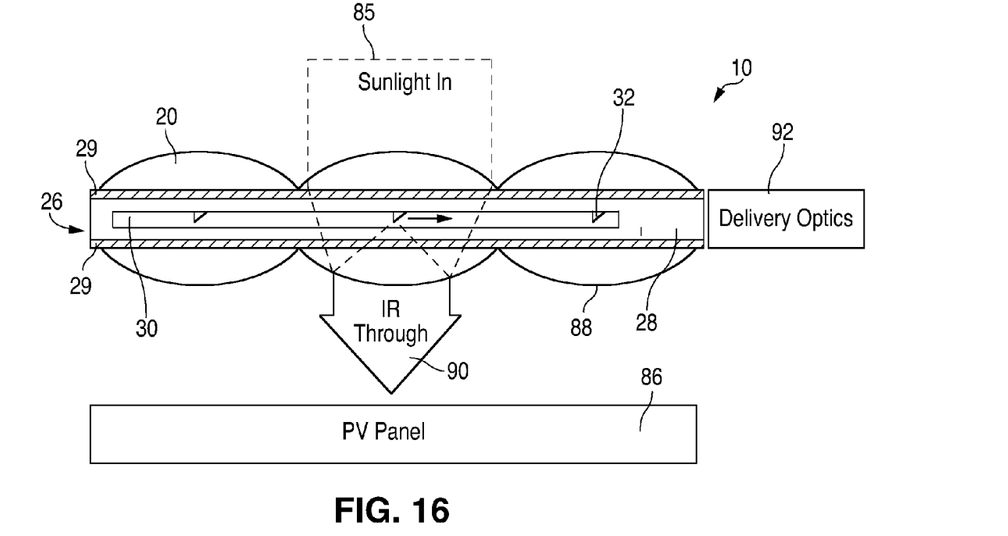
FIG. 16 illustrates the use of the solar concentrator to supply IR light to a PV panel, while visible light is directed to the edge of a lightguide for extraction and delivery to the inside of a building.

FIG. 16 shows a light-capturing panel 84 placed above a conventional PV panel 86 of PV cells. Sunlight 85 is shown entering the lenses 20. The surface of the focusing mirrors 88 in the catadioptric system is coated with a wavelength-selective reflector that reflects the visible light desired for lighting but allows infrared (IR) light 90 to transit through to the PV panel 86. The PV panel converts the infrared light to electricity. The visible light is reflected sideways by the tilted mirrors 32 to the light delivery system 92 for illumination inside a building. The sheet 30 is movable within the fluid 28 as discussed above. In this way, the system is able to make effective use of the majority of the solar spectrum.

Figure 17:
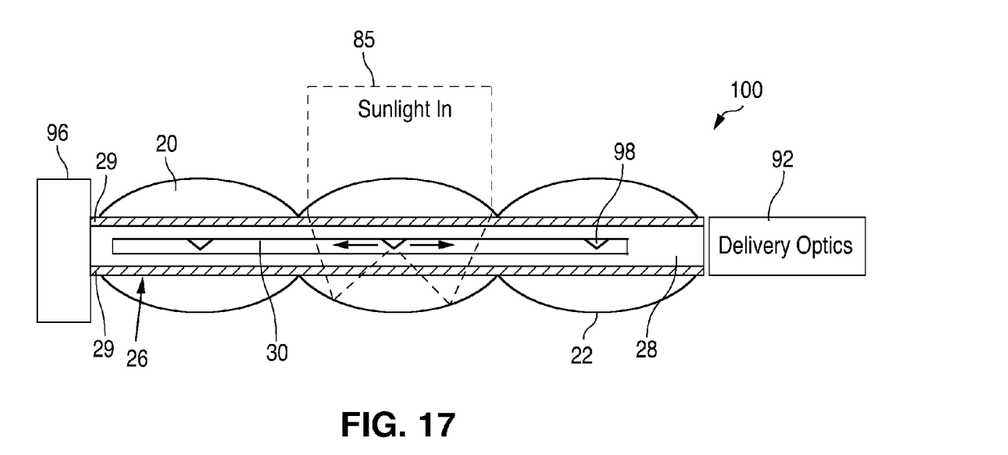
FIG. 17 illustrates the use of the solar concentrator to split the sunlight between PV cells and a light delivery system for illuminating the inside of a building.

FIG. 17 shows a system in which PV cells 96 are mounted on (or near) the edge of the lightguide 26 cavity opposite to where the light transmission delivery system 92 connects. The tilted mirrors 98 (or other reflectors) on the movable sheet 30 have two angles: one that deflects light toward the light transmission delivery system 92 and one that deflects light toward the PV cells 96 along the opposite edge of the lightguide 26. By adjusting the position of the movable sheet 30 in relation to the focal spot, the focused light can be sent to one or the other of these edges, or split between them as desired. In this system, any sunlight that is not used for lighting can be collected for photovoltaic electricity generation. For example, a system may be controlled to send most sunlight toward the PV cells 96 during the middle of the day (when the panel 100 receives a great deal of sunlight) and most sunlight toward the light transmission delivery system 92 at other times of the day (when the panel receives less sunlight), thus providing a nearly constant light output for use in illumination while capturing excess light for conversion into electricity.

A further variation of the design is to replace the PV cells 96 with thermal absorbers that capture the excess sunlight for useful heat generation, such as to heat water.

In another embodiment, the structure may be used to direct light in a path that is the reverse of that described above. Light may enter an edge of the lightguide and be uniformly output across the entire top of the panel by deflection off the tilted mirrors and collimated by the focusing mirrors and refractive lenses. The direction of output from the entire top of the panel can be adjusted by adjusting the position of the movable sheet. The system designs presented herein may be used for purposes other than interior lighting or electricity generation. Concentrated sunlight produced by the panel may be used exclusively for heat generation by replacing the transmission optics with heat capture devices, for example, an evacuated tube receiver that contains a flowing thermal fluid.

The movable lightguide portion within the stationary cavity may also be used in applications other than concentrating sunlight. In such cases, the refractive lenses and concave focusing mirrors may not be needed. For example, the incoming light may be from a laser. The movable sheet allows the laser to be coupled into the lightguide at a broad range of positions, which is not possible in conventional lightguides with fixed coupling features. In another example, light from a laser may be input into the edge of the lightguide, and tilted reflectors on the movable sheet within the fluid redirect the light to optics distributed across the surface of the cavity to provide a uniform or directed light emission or other desired light emission. Movement of the sheet may cause the output beam to be directed at virtually any desired angle. Many other applications are possible.

While particular embodiments of the present invention have been shown and described, it will be obvious to those skilled in the art that changes and modifications may be made without departing from this invention in its broader aspects and, therefore, the appended claims are to encompass within their scope all such changes and modifications.

What is claimed is:

1. An optical system comprising:
    an array of refractive lenses for receiving external light;
    an array of focusing mirrors, wherein each mirror is paired with one of the lenses, and wherein the light entering the lenses is focused by the associated mirrors on a focal plane between the lenses and the mirrors;
    a lightguide between the lenses and mirrors, the lightguide comprising a movable transparent solid sheet containing reflective elements having a tilted reflective surface, the reflective elements being in a focal plane of the light focused by the mirrors, wherein light from the focusing mirrors reflecting off the reflective elements is redirected to at least a first light extraction edge of the lightguide;
    a transparent fluid substantially surrounding the sheet within a cavity,
    wherein the sheet is movable within the fluid, and with respect to the fluid, to position the reflective elements in a desired alignment with focal spots of light within the focal plane to control an amount of light emitted through the first light extraction edge of the lightguide;
    a sensor that provides a signal indicating a position of the sheet relative to the focal spots of light within the focal plane; and
    an actuator coupled to the sheet for translating the sheet, based on the signal provided by the sensor, to position the reflective elements in the desired alignment with focal spots of light within the focal plane,
    wherein the cavity has a stationary, transparent window optically coupled to the first light extraction edge of the lightguide, allowing light to consistently pass through the window despite movement of the sheet within the fluid.

2. The system of claim 1 wherein a refractive index of the fluid is substantially the same as, or higher than, the refractive index of the sheet, the system further comprising cladding layers sandwiching the fluid, the cladding layers having a refractive index lower than the refractive index of the fluid and sheet such that there is TIR at the interface of the fluid and cladding layers.

3. The system of claim 2 wherein the cladding layers form part of a cavity abutting the fluid.

4. The system of claim 1 wherein at least portions of the cavity, other than the transparent window, enclosing the fluid and sheet are transparent.

5. The system of claim 4 wherein the transparent cavity has a cladding layer that has an index of refraction lower than that of the fluid and sheet.

6. The system of claim 5 wherein the cladding layer is an outer layer of the cavity.

7. The system of claim 5 wherein the cladding layer is an inner layer of the cavity.

8. The system of claim 1 wherein the fluid forms part of the lightguide and guides light along with the sheet.

9. The system of claim 1 further comprising a light transmission device optically coupled to the first light extraction edge of the lightguide, the light transmission device transporting light for illumination of a room.

10. The system of claim 1 further comprising a photovoltaic device optically coupled to the first light extraction edge of the lightguide.

11. The system of claim 1 wherein the actuator is magnetically coupled to the sheet for translating the sheet to position the reflective elements in the desired alignment with focal spots of light within the focal plane.

12. The system of claim 1 wherein the sensor generates an electrical signal related to an amount of light impinging on the sensor.

13. The system of claim 1 wherein the actuator comprises a mechanism within the fluid for translating the sheet within the fluid to achieve a desired position of the reflective elements relative to focal spots in the focal plane between the lenses and the mirrors.

14. The system of claim 1 wherein the sensor is located on the sheet and provides a light signal related to an amount of light impinging on the sensor.

15. The system of claim 1 wherein the reflective elements have at least two tilted surfaces for redirecting light to the first light extraction edge of the lightguide and to a second extraction edge of the lightguide.

16. The system of claim 15 wherein a light transmission device is optically coupled to the first light extraction edge of the lightguide and a photovoltaic device is optically coupled to the second light extraction edge of the lightguide.

17. The system of claim 1 wherein the fluid is an oil.

18. The system of claim 1 wherein the array of focusing mirrors pass infrared light and reflect visible light, the system further comprising a photovoltaic panel below the focusing mirrors for receiving the infrared light and generating electricity.

19. The system of claim 1 wherein the tilted reflective surface of the reflective elements is flat.

20. An optical system comprising:
an array of refractive lenses for receiving external light;
an array of focusing mirrors, wherein each mirror is paired with one of the lenses, and wherein the light entering the lenses is focused by the associated mirrors on a focal plane between the lenses and the mirrors;
a lightguide between the lenses and mirrors, the lightguide comprising a movable transparent solid sheet containing reflective elements having a tilted reflective surface, the reflective elements being in a focal plane of the light focused by the mirrors, wherein light from the focusing mirrors reflecting off the reflective elements is redirected to at least a first light extraction edge of the lightguide;
a transparent fluid substantially surrounding the sheet within a cavity,
wherein the sheet is movable within the fluid, and with respect to the fluid, to position the reflective elements in a desired alignment with focal spots of light within the focal plane to control an amount of light emitted through the first light extraction edge of the lightguide;
a sensor that provides a signal indicating a position of the sheet relative to the focal spots of light within the focal plane; and
an actuator coupled to the sheet for translating the sheet, based on the signal provided by the sensor, to position the reflective elements in the desired alignment with focal spots of light within the focal plane,
wherein the fluid is a liquid.

21. The system of claim 20 wherein the cavity has a stationary, transparent window optically coupled to the first light extraction edge of the lightguide, allowing light to consistently pass through the window despite movement of the sheet within the fluid.

22. An optical system comprising:
a lightguide comprising a movable transparent solid sheet containing reflective elements having a tilted reflective surface for redirecting light entering the sheet;
a transparent liquid substantially surrounding the sheet within a cavity,
wherein the sheet is movable within the liquid, and with respect to the liquid, to position the reflective elements in a desired manner to direct light entering the sheet to an output surface of the sheet;
optical elements focusing light onto focal spots on the sheet, wherein the sheet is positioned in a focal plane of the optical elements;
a sensor that provides a signal indicating a position of the sheet relative to the focal spots within the focal plane; and
an actuator coupled to the sheet for translating the sheet, based on the signal provided by the sensor, to position the reflective elements in the desired alignment with focal spots of light within the focal plane.

23. The system of claim 22 wherein the liquid has a refractive index substantially the same as, or higher than, that of the sheet, and wherein walls of the cavity have a refractive index lower than that of the liquid such that there is TIR off the walls of the cavity.

24. The system of claim 23 wherein the walls of the cavity comprise a low refractive index film on a transparent material.

* * * * *